(12) United States Patent
Scott

(10) Patent No.: US 7,109,642 B2
(45) Date of Patent: Sep. 19, 2006

(54) COMPOSITE PIEZOELECTRIC APPARATUS AND METHOD

(76) Inventor: Walter Guy Scott, 11662 Lake Shore Pl., North Palm Beach, FL (US) 33408

( * ) Notice: Subject to any disclaimer, the term of this patent is extended or adjusted under 35 U.S.C. 154(b) by 0 days.

(21) Appl. No.: 10/998,130

(22) Filed: Nov. 29, 2004

(65) Prior Publication Data

US 2005/0156491 A1    Jul. 21, 2005

Related U.S. Application Data

(60) Provisional application No. 60/525,927, filed on Nov. 29, 2003.

(51) Int. Cl.
*H01L 41/04*    (2006.01)
*H01L 41/08*    (2006.01)

(52) U.S. Cl. .................. 310/334; 310/358; 367/155; 367/157; 600/347; 204/192.15; 204/192.18; 29/25.35

(58) Field of Classification Search ............... 310/358; 367/155, 157; 600/347
See application file for complete search history.

(56) References Cited

U.S. PATENT DOCUMENTS

| | | | |
|---|---|---|---|
| 4,330,593 A | 5/1982 | Shrout et al. ............... 428/407 |
| 4,412,148 A * | 10/1983 | Klicker et al. .............. 310/358 |
| 4,628,223 A * | 12/1986 | Takeuchi et al. ............ 310/358 |
| 4,658,176 A * | 4/1987 | Nakaya et al. .............. 310/334 |
| 4,683,396 A * | 7/1987 | Takeuchi et al. ............ 310/358 |
| 4,726,099 A | 2/1988 | Card et al. .................. 29/25.35 |
| 4,755,707 A * | 7/1988 | Nakaya et al. .............. 310/334 |
| 4,801,835 A * | 1/1989 | Nakaya et al. .............. 310/358 |
| 4,825,115 A | 4/1989 | Kawabe et al. ............. 310/327 |
| 4,876,776 A * | 10/1989 | Whatmore et al. ......... 29/25.35 |
| 4,894,194 A | 1/1990 | Janney ........................ 264/109 |
| 4,944,891 A | 7/1990 | Sagong et al. ......... 252/62.9 PZ |
| 4,978,643 A | 12/1990 | Venkataswamy et al. ..... 419/40 |
| 5,028,362 A | 7/1991 | Janney et al. ............... 264/432 |
| 5,083,568 A | 1/1992 | Shimazaki et al. .......... 600/459 |
| 5,145,900 A | 9/1992 | Sterzel et al. ............... 524/404 |

(Continued)

FOREIGN PATENT DOCUMENTS

EP    1 306 148 A1    5/2003

(Continued)

OTHER PUBLICATIONS

Gebhardt, S. and Schönecker, A.,*Materials Mechanics, Fracture Mechanics, Micro Mechanics (Preprint)*, 1999, 5 pages available at http://www.smart-material.com/Whatis.php, last accessed Aug. 10, 2005.

(Continued)

*Primary Examiner*—Darren Schuberg
*Assistant Examiner*—J. Aguirrechea
(74) *Attorney, Agent, or Firm*—Sterne, Kessler, Goldstein & Fox P.L.L.C.

(57) ABSTRACT

The present invention relates to composite piezoelectric apparatus, transducers and methods of manufacture. In an embodiment, a composite piezoelectric apparatus has a sacrificial base and pillar array. Different volume percents of piezoelectric material are used in the sacrificial base and pillar array. A first volume percent in the base is lower than the second volume percent in the pillar array. In this way, the sacrificial base can be easily removed from the pillar array after the base and pillar array are sintered in the manufacture of a final composite piezoelectric transducer. A method of manufacturing a composite piezoelectric transducer from a sacrificial base and pillar array and a composite piezoelectric transducer made by the method are provided. A composite piezoelectric transducer stack is provided.

10 Claims, 2 Drawing Sheets

U.S. PATENT DOCUMENTS

| | | | |
|---|---|---|---|
| 5,145,908 A | | 9/1992 | Jenny et al. ................. 524/827 |
| 5,334,903 A | * | 8/1994 | Smith ......................... 310/358 |
| 5,340,510 A | | 8/1994 | Bowen ........................ 264/434 |
| 5,362,791 A | | 11/1994 | Ebenhoech et al. .......... 524/440 |
| 5,456,877 A | | 10/1995 | Tiegs et al. ................... 419/30 |
| 5,539,965 A | * | 7/1996 | Safari et al. ................ 29/25.35 |
| 5,615,466 A | * | 4/1997 | Safari et al. ................ 29/25.35 |
| 5,660,877 A | | 8/1997 | Venkataramani et al. ... 427/100 |
| 5,684,884 A | * | 11/1997 | Nakaya et al. .............. 381/190 |
| 5,691,960 A | | 11/1997 | Gentilman et al. .......... 367/155 |
| 5,695,697 A | | 12/1997 | Trübenbach et al. ....... 264/29.1 |
| 5,722,137 A | * | 3/1998 | Lorraine et al. ........... 29/25.35 |
| 5,818,149 A | | 10/1998 | Safari et al. ................. 310/358 |
| 5,844,349 A | | 12/1998 | Oakley et al. ............... 310/358 |
| 5,869,767 A | * | 2/1999 | Hayward et al. .............. 73/774 |
| 5,885,493 A | | 3/1999 | Janney et al. ............. 264/37.18 |
| 5,950,291 A | * | 9/1999 | Gentilman et al. ......... 29/25.35 |
| 6,020,675 A | * | 2/2000 | Yamashita et al. .......... 310/358 |
| 6,051,913 A | | 4/2000 | King .......................... 310/327 |
| 6,066,279 A | | 5/2000 | Walls et al. ................. 264/118 |
| 6,088,894 A | | 7/2000 | Oakley et al. .............. 29/25.35 |
| 6,179,894 B1 | | 1/2001 | Gay ............................. 75/230 |
| 6,228,299 B1 | | 5/2001 | Janney et al. ............... 264/118 |
| 6,262,517 B1 | | 7/2001 | Schmidt et al. ............. 310/334 |
| 6,352,763 B1 | | 3/2002 | Dillon et al. ................ 522/182 |
| 6,365,082 B1 | | 4/2002 | Walls et al. ................. 428/325 |
| 6,488,871 B1 | | 12/2002 | Nomura et al. ................ 264/6 |
| 6,713,526 B1 | | 3/2004 | Dillon et al. ................ 522/182 |
| 6,720,712 B1 | | 4/2004 | Scott et al. .................. 310/339 |
| 6,868,594 B1 | * | 3/2005 | Gururaja .................... 29/25.35 |
| 6,919,668 B1 | * | 7/2005 | Nagahara et al. ........... 310/358 |
| 2002/0101646 A1 | * | 8/2002 | Ide et al. ..................... 359/295 |
| 2005/0156362 A1 | | 7/2005 | Arnold et al. ............... 264/618 |
| 2005/0203231 A1 | | 9/2005 | Halpert et al. ............... 524/413 |

FOREIGN PATENT DOCUMENTS

| | | |
|---|---|---|
| WO | WO 88/07505 A1 | 10/1988 |
| WO | WO 01/71648 A2 | 9/2001 |

OTHER PUBLICATIONS

Gebhardt, S. et al., "Fine Scale 1-3 Composites Fabricated by the Soft Mold Process: Preparation and Modeling," *Ferroelectrics* 241:67-73, Overseas Publishers Association (2000).

Gebhardt, S. et al., "Quasistatic and dynamic properties of 1-3 composites made by soft molding," *J. Eur. Ceramic Soc.* 23:153-159, Elsevier Science Ltd. (2003).

*MSI: Technologies*, 3 pages available at http://www.matsysinc.com/coretech.html (printed May 19, 2004).

Mueller, V. et al., "Characterization of Nonlinear Properties of Soft PZT—Piezoceramics," *Ferroelectrics* 240:67-74, Overseas Publishers Association (2000).

Qiu, J. et al., "Fabrication of piezoeletric ceramic fibers by extrusion of Pb(Zr, Ti)$O_3$ powder and Pb(Zr, Ti)$O_3$ sol mixture," *Smart Materials and Structures* 12:331-337, IOP Publishing Ltd. (Jun. 2003).

Steihausen, R. et al., "Finescaled Piezoelectrics 1-3 Composites: Properties and Modeling," *J. Eur. Ceramic Soc.* 19:1289-1293, Elsevier Science Limited (1999).

* cited by examiner

COMPOSITE PIEZOELECTRIC APPARATUS AND METHOD

This application claims the benefit of U.S. Provisional Appl. No. 60/525,927, filed Nov. 29, 2003 (incorporated in its entirety herein by reference for all purposes).

BACKGROUND OF THE INVENTION

1. Field of the Invention

The present invention relates generally to ultrasonic transducers and their fabrication.

2. Related Art

Composite piezoelectric transducers are devices that comprise part sintered, densified ceramic (for example, lead zirconate titanate (PZT)) embedded in a polymer. The composite structure enhances the efficiency of electrical to mechanical energy conversion and propagation, and in reverse, mechanical to electrical energy conversion. The geometry of the structure can have many forms. One example geometry is a 1–3 composite. This 1–3 refers to a material where the electrical field is applied through the thickness of a plate and the mechanical motion is also in this direction.

The composite structure derives performance improvements in two main processes:

a) Firstly, the overall density of the composite is less that pure ceramic which in the case of PZT is approximately 8. This density and mechanical modulus gives rise, to an acoustic index of ~30 megarayls (Mrayls). Most uses for transducers are either in medical or sonar applications where the medium of tissue or water has an acoustic index of about 1.5 Mrayls. This mismatch causes large coupling losses at the interface of the transducer and the material. A mechanical transformer in the form of matching layers of ¼ wavelength thickness of material with intermediate acoustic densities then needs to be inserted between the transducer and the material. The efficiency of energy transfer is thus limited to the affectivity of this mechanical transformer, which is compromised by the lack of materials available with acoustic indexes of about 6–20 Mrayls. By using a composite made up of a mixture of polymer and ceramic, a composite transducer can have an acoustic index of about 4–10 Mrayls depending on the percentage of ceramic in the transducer. This is much easier to couple to the target mediums and higher coupling efficiencies are achieved.

b) Secondly, under the stress of an electrical field a piezoelectric material ("piezo material") will change its shape. This will cause internal stresses which hold the material in its solid form. If the piezo material is in the form of long, thin pillars, then the forces opposing the lengthening of the pillar will be the force of thinning the pillar that allows material to become part of the length extension. In a solid mass of ceramic this sideways resistance is substantial and only small displacements are possible. If the pillar is held in a polymer, then this resistance to thinning is minimal allowing the pillar to extend its length at a greater efficiency.

Composite material is made by a technique known as dice and fill where a solid block of sintered PZT is sliced into plates and then the plates are diced (partially cut over their flat surfaces with a thin blade) these cuts are then filled with a polymer and then the supporting back of the PZT is ground off leaving just pillars embedded in the polymer. This is an expensive and laborious task with quality and yield difficulties.

SUMMARY OF THE INVENTION

The present invention relates to composite piezoelectric apparatus, transducers and methods of manufacture. In an embodiment, a composite piezoelectric apparatus has a sacrificial base and pillar array. The sacrificial base has a first composite piezoelectric material. The first composite piezoelectric material has a first volume percent of first piezoelectric material. The pillar array has a plurality of pillars. Each pillar has a second composite piezoelectric material. The second composite piezoelectric material has a second volume percent of second piezoelectric material. The first volume percent is lower than the second volume percent. In this way, the sacrificial base can be easily removed from the pillar array after the base and pillar array are sintered in the manufacture of a final composite piezoelectric transducer.

In an embodiment, the first volume percent is about 30–40% of first piezoelectric material, and the second volume percent is about 50–65% of the second piezoelectric material. The first and second piezoelectric materials can be the same or different piezoelectric material including, but not limited to, lead zirconate titanate (PZT), lead niobium titanate (PNT), and lead scandium niobium titanate (PSNT). In one particular example, not intended to limit the invention, the first volume percent is about 36% of PZT, and the second volume percent is about 60%–65% of PZT.

In further embodiments, a method of manufacturing a composite piezoelectric transducer from a sacrificial base and pillar array and a composite piezoelectric transducer made by the method are provided. The method includes molding the sacrificial base and the pillar array with first and second slips, respectively. The first slip has a first composite piezoelectric material with a first volume percent of first piezoelectric material. The second slip having a second composite piezoelectric material, said second composite piezoelectric material having a second volume percent of second piezoelectric material, wherein said first volume percent is lower than said second volume percent, whereby, said sacrificial base can be easily removed from the pillar array after the molded base and pillar array are sintered in the manufacture of the composite piezoelectric transducer.

According to a further feature, the method includes inserting interstitial material around longitudinal sides of the pillars of the pillar array, and forming air pockets on one end side of the pillars within the composite piezoelectric transducer. In a further example, the air pockets forming step includes, but is not limited to, lithographically etching a photoresistive substrate to form etched pits at positions corresponding to pillar positions.

According to a further embodiment, a composite piezoelectric transducer stack is provided. The composite piezoelectric transducer stack includes a pillar array having pillar regions made up of piezoelectric material and separated by interstitial material, element electrodes coupled to pillars in the pillar array, and a photoresistive substrate having etched pits. The etched pits are opposite one end side of the pillars to form air pockets within the composite piezoelectric transducer.

Further embodiments, features, and advantages of the invention, as well as the structure and operation of the various embodiments of the invention are described in detail below with reference to accompanying drawings.

BRIEF DESCRIPTION OF THE DRAWINGS/FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF EMBODIMENTS OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

In embodiments, the present invention relates to composite piezoelectric apparatus, transducers and methods of manufacture.

Different Composite Material Volume Percents

Figure 1:
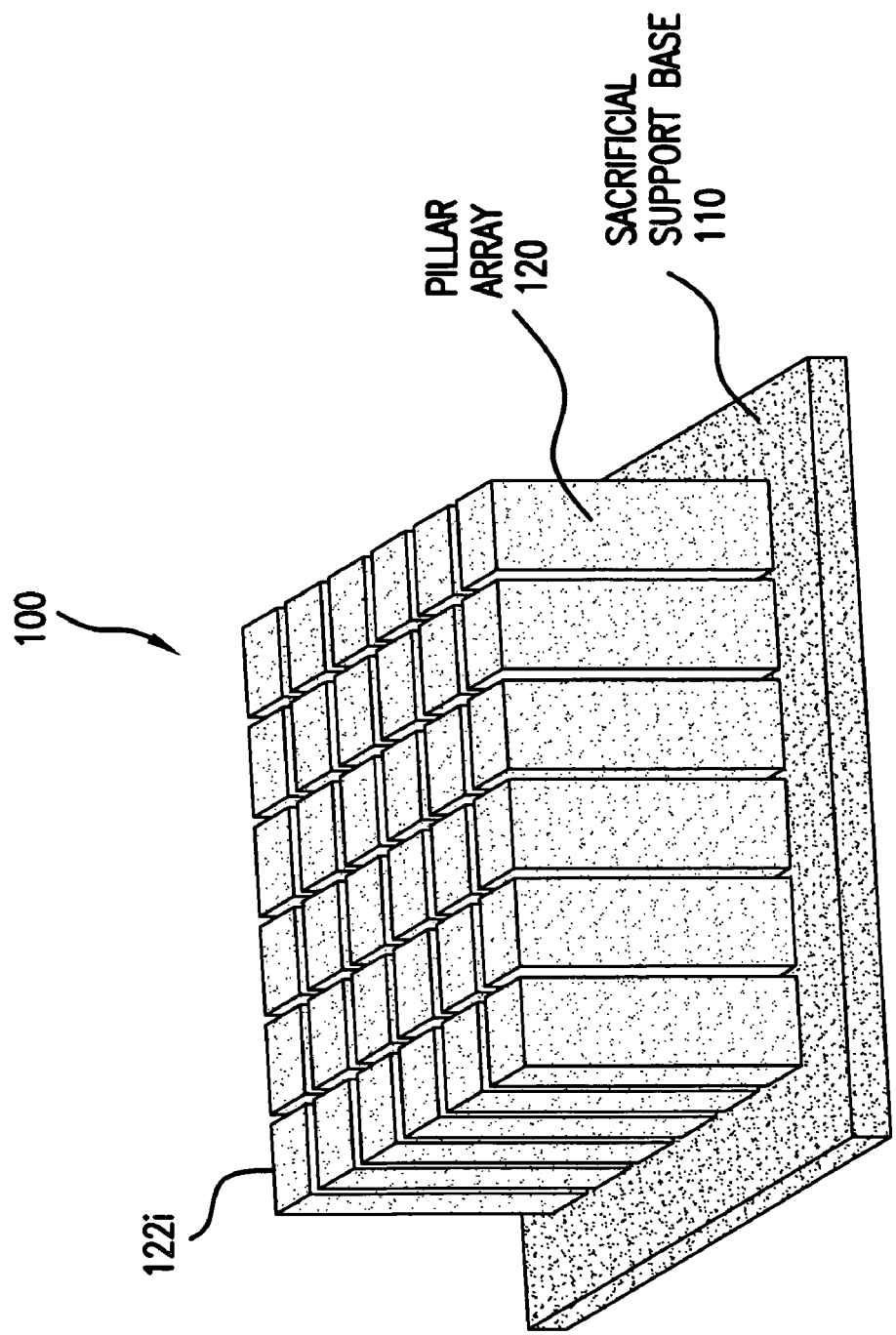
FIG. 1 is a diagram of a composite piezoelectric apparatus with a sacrificial base and pillar array according to an embodiment of the present invention.

FIG. 1 is a diagram of a composite piezoelectric apparatus 100 having a sacrificial base 110 and pillar array 120 according to an embodiment of the present invention. Sacrificial base 110 has a composite piezoelectric material made up of piezoelectric material at a first volume percent. Likewise, pillar array 120 is made up of a number of pillars $122_i$. Only a 6×6 array of 36 pillars is shown for clarity; however, the present invention is not so limited. Indeed, smaller or larger numbers of pillars made be used in any desired arrangement. Each pillar $122_i$ can have a cross-sectional shape that is square, rectangular, round or any other type cross-sectional shape. Pillar array 120 (and each pillar $122_i$) has a composite piezoelectric material made up of piezoelectric material at a second volume percent. According to a feature of the invention, the first volume percent is lower than the second volume percent. In this way, the sacrificial base can be easily removed from the pillar array after the base and pillar array are sintered in the manufacture of a final composite piezoelectric transducer.

In an embodiment, the first volume percent is about 30–40% of first piezoelectric material, and the second volume percent is about 50–65% of the second piezoelectric material. The first and second piezoelectric materials in base 110 and pillar array 120 respectively, can be the same or different piezoelectric material including, but not limited to, lead zirconate titanate (PZT), lead niobium titanate (PNT), and lead scandium niobium titanate (PSNT). In one particular example, not intended to limit the invention, the first volume percent is about 36% of PZT, and the second volume percent is about 60%–65% of PZT.

In one application, composite piezoelectric apparatus 100 is an intermediate article (such as a green body formed by molding) that occurs during a process of manufacturing a composite piezoelectric transducer. Such a composite piezoelectric transducer can include but is not limited to a personal identification device (e.g., a fingerprint sensor device) as described in International Appl. No. PCT/US01/09187, which is hereby incorporated by reference herein in its entirety for all purposes. See, for example, the method of manufacturing a piezoceramic sensor including forming a green body by molding described in a co-pending, commonly-owned U.S. patent application, entitled "Piezoelectric Device and Method of Manufacturing Same", by J. Arnold et al., U.S. application Ser. No. 10/998,129, filed Nov. 29, 2004, which is incorporated herein by reference in its entirety for all purposes.

In a further embodiment, a method of manufacturing a composite piezoelectric transducer from sacrificial base 110 and pillar array 120. The method includes molding the sacrificial base and the pillar array with first and second polymer ceramic slips, respectively. The first slip is injected into a mold (such as a silicone rubber mold) to form sacrificial base 110 when the first slip sets. The second slip is injected into a mold also (such as a silicone rubber mold) to form pillar array 120 when the second slip sets. As described above, the first and second slips have piezoelectric material at first and second volume percents that are different.

The slips can each further comprise additional materials. Examples of additional materials include, but are not limited to, surfactants, dispersants, and polymer. Any polymer can be used that is capable of binding the piezoelectric material. Specific examples of polymers for use include, but are not limited to, epoxies, polyesters, polyamides, silicones, and polyurethanes and mixtures or copolymers thereof. Polymer is used herein to include prepolymers and prepolymer precursor, such as, uncured epoxy precursors.

When set, apparatus 100 is removed from one or more molds and sintered. Interstitial material can also be added around pillars 122 in pillar array 120. The presence of sacrificial base 110 allows easier handling and transport of pillar array 120 during sintering and molding or injection of the interstitial material and provides protection for the integrity of the pillars 122 in pillar array 120. After sintering, because the second ratio is lower than the first ratio, the sacrificial base 110 can be easily removed from pillar array 120. For instance, sacrificial base 110 can be simply brushed off which avoids more complex machining. This variation in the loading of PZT in a epoxy slip to have two ratios allows structure 100 to be held together during burnout and sintering and allows the surplus material to be removed with little mechanical force once the sintered part has been secured in an interstitial polymer.

This varying of volume percent PZT can be used to form a mixed volume percent composition piezoelectric transducer with an array of sensing pillars. A slip with a lower volume percent PZT content (as used for base 110 in FIG. 1) will be stronger as a catalyzed slip, but when sintered the lower percentage of PZT will form a poor structure (also called a sacrificial structure) which can be temporally used to hold the structure together as a sintered piece and allow the introduction of a interstitial polymer to the dense areas of the part, but can be easily removed (i.e., brushed off) to allow the composite to have a net shape with a minimum of machining. A slip with a higher volume percent PZT content (as used in pillar array 120 in FIG. 1) will have the piezoelectric performance required and will weld to the more porous base at the high sintering temperature. The percentage of PZT in the base 110 (low percentage PZT sacrificial layer of slip) can be varied to adjust shrinkage and bring the pillars 122 closer together than they were molded if required.

According to a further feature, the method includes inserting interstitial material around longitudinal sides of the pillars of the pillar array, and forming air pockets on one end side of the pillars within the composite piezoelectric transducer. In a further example, the air pockets forming step includes, but is not limited to, lithographically etching a photoresistive substrate to form etched pits at positions corresponding to pillar positions.

Composite Piezoelectric Transducer Stack

Figure 2:
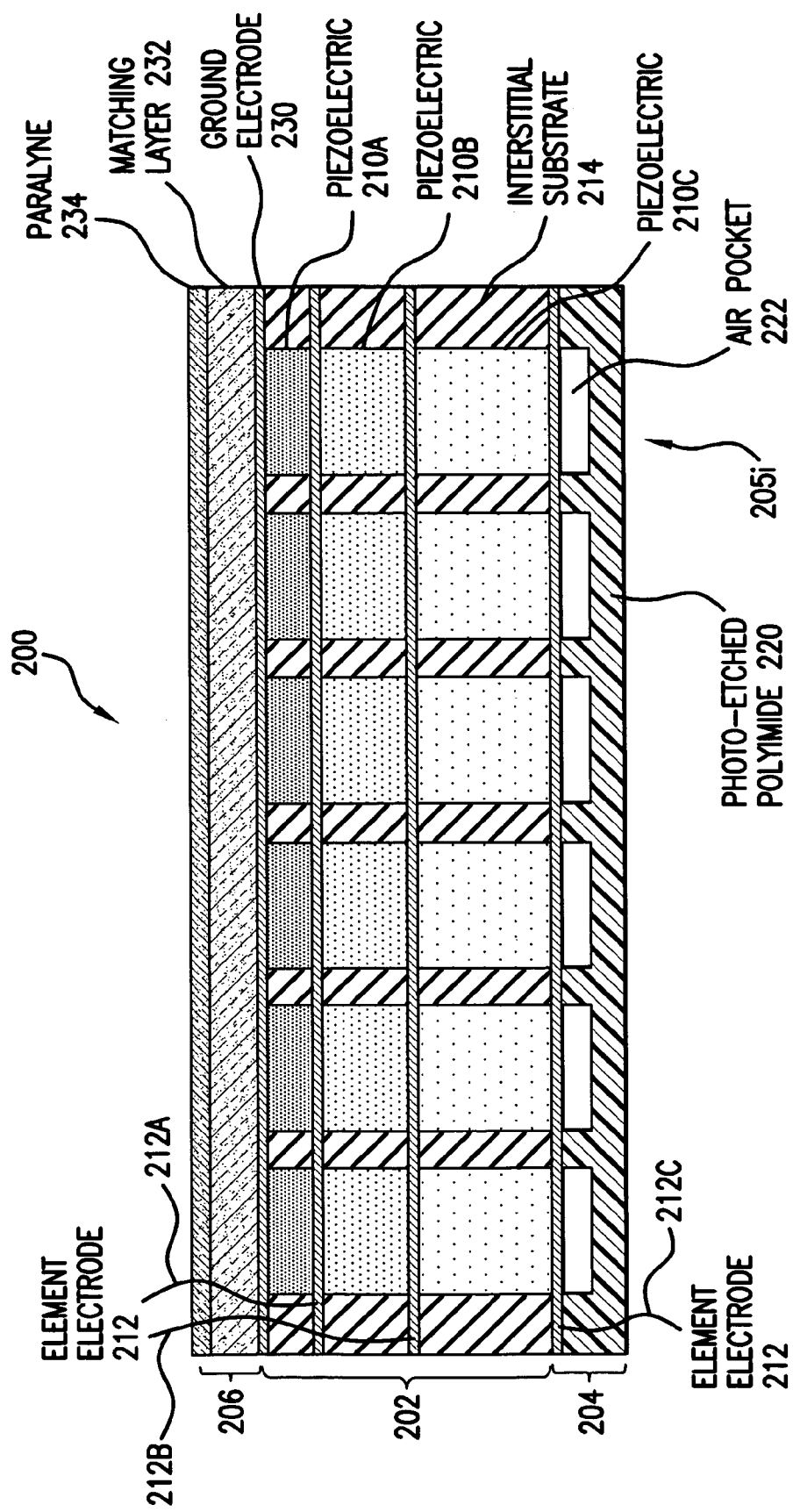
FIG. 2 is a diagram of a composite piezoelectric transducer stack according to an embodiment of the present invention.

FIG. 2 is a cross-sectional side view diagram of a composite piezoelectric transducer stack 200 according to a further embodiment of the present invention. Composite piezoelectric transducer stack 200 includes a pillar array having pillar regions $205_i$. Each pillar region $205_i$ is made up of piezoelectric material (such as PZT) and separated by interstitial material (such as an epoxy), element electrodes coupled to pillars in the pillar array, and a photoresistive substrate 220 having etched pits. The etched pits are opposite one end side of pillar regions $205_i$ to form air pockets 222 within the composite piezoelectric transducer.

In an example shown in FIG. 2, composite piezoelectric transducer stack 200 has three regions 202, 204, 206. Region 202 is located in between region 204 and 206. To ease discussion and orientation, it is helpful to consider a top to bottom direction. In this sense, region 204 can be considered on top of region 202 and region 206 on the other side on a bottom of region 202. Region 202 includes three piezoelectric material layers 210A–C, three element electrode layers 212A–C, and ground electrode layer 230. First piezoelectric material layer 210A is at the top of region 202 is electrically coupled to ground electrode 230 on one side and first element electrode 212A on another side. Second piezoelectric material layer 210B in located below layer 210A and is electrically coupled to ground electrode 230 on one side (for instance through vias in interstitial material 214 in between pillar regions) and second element electrode 212B on another side. Third piezoelectric material layer 210C in located below layer 210B and is electrically coupled to ground electrode 230 on one side and second element electrode 212C on another side.

In an example not intended to limit the present invention: first piezoelectric material layer 210A includes a layer of PZT at a thickness of about 35 microns, second piezoelectric material layer 210B includes a layer of PZT at a thickness of about 50 microns, third piezoelectric material layer 210C includes a layer of PZT at a thickness of about 70 microns; first-third elements electrodes 212A–C are each about 8 microns thick and made of but not limited to a metal such as chromium, gold, aluminum, indium-gold-chromium; and ground electrode 230 is about element electrode 212A 3 microns thick and made of but not limited to a metal such as chromium, gold, aluminum, and indium-gold-chromium.

Region 204 includes a photoresistive substrate 220 having etched pits (such as a photo-etched polyimide layer on a substrate). The etched pits are opposite one end side of pillar regions $205_i$ to form air pockets 222 within the composite piezoelectric transducer. These pits may be formed by lithography using the PZT pillars, which are opaque, as the mask. This method will provide alignment of the resultant pit to the shadow of the pillar. The interstitial polymer substrate can be chosen to be transparent for this purpose and for the purpose of aligning the stack in assembly.

Region 206 has an acoustic matching layer 232 on top of ground electrode layer 230 and a protective shield layer 234. In an example not intended to limit the invention, acoustic matching layer 232 can be 28 microns thick and made of polyvinylidene fluoride (PVDF) matching layer material and protective shield layer 234 can be about 5 microns thick and made of a paraxylene material, for example, a PARALYNE material.

Further Embodiments and Discussion

Manufacture

The present invention provides methods of constructing composite piezoelectric transducers at improved performance and lower cost. In one embodiment, composite piezoelectric transducers have pillars molded prior to sintering in a soft silicone rubber mold. The PZT is in the form of a fine powder that is mixed into a paste with a binder. In an example, the paste comprises about 50% by volume PZT the partials will be close enough to density in sintering which leads to a material with good piezoelectric properties.

In contrast, traditionally this paste or "green" has been made from water and poly vinyl alcohol (PVA) glue. The green is placed in molds as is done in crockery manufacturing. The green is then dried to remove the water and the delicate item is then burnt out at an elevated temperature (~600 degrees Celsius or more) to remove all water and oxidize out the PVA. The item is the sintered at a higher temperature so partials will melt and be drawn into one another ("densify") and attain mechanical strength.

Manufacturing PZT according to embodiments of the present invention is different from ceramic manufacturing. For instance, efforts must be made to avoid voids and to densify the ceramic as much as possible. Processes such as "hot iso-static pressing" and sintering in a vacuum furnace can do this. Unfortunately, the lead in PZT is highly volatile at the sintering's elevated temperatures so the sintering must be done under a lead atmosphere where the vapor pressure of the lead in the gaseous state is sufficient to keep the lead from sublimating out of the PZT.

It has been determined by the inventor that binders other than PVA are suitable for binding the PZT where about 50% volume of PZT in the green is attained and the binder can be burnt out of the piece before sintering. Modern glues have been developed with very low viscosities that allow the green to accommodate the high percentage of PZT power and flow easily into intricate molds. Various additives, which apply charges to the partials' surfaces, can also assist in reducing the viscosity of the green (or slip as it is also known).

In one embodiment the binder is made from epoxy glue, which provides the required features to support the 50% loading of PZT and have a low viscosity for molding. This slip can be pressed or sucked into the mold and then the epoxy can be hardened either by the earlier addition of catalysts and/or by adding energy to the slip by heating or microwaving or exposing to another form of radiation as for example light or x-rays. Thus the slip will be robust and able to keep its form during de-molding and movement to the furnace for burnout and sintering. This epoxy slip does not involve the long time requirements of a drying cycle and there are no evaporants so the shape is kept with out shrinkage as a net shape. The strength of the catalyzed epoxy is significantly greater than the water based slips and can support finer structures.

The PZT can also be fabricated by a stereo lithography process (SLA) process where a laser or light beam or energy beam is directed to a surface of the part and the catalyzed epoxy is built up into the final component shape and the liquid slip poured out allowing construction of very complex shapes with cavities prior to sintering.

Polymers are also suitable as binders and their different characteristics can be put to use. Urethanes will shrink slightly and have excellent separation characteristics from silicon molds. Urethanes can be used as a lost wax type process where the urethane remains resident with the PZT slip and is burnt out prior to sintering. Silicone rubber binders can be used where the burnt out residue of the silicone rubber is a SiO2 glass and can be incorporated into the final sintered PZT ceramic or can be part of a lost wax mold which will end up as part of the wall structure PZT ceramic.

In one embodiment a mold made from a microelectrical mechanical systems (MEMS) technique is used to shape a silicone rubber master mold, which is used to shape an epoxy slip of PZT in the form of high aspect ratio (up to 10:1) pillars in an array. The pillars are 50%+ PZT in the epoxy slip and another layer of lower percentage PZT epoxy is molded to the opposite side of the pillar matrix from the silicone rubber mold as shown in FIG. 1 described above. When the epoxy slip has hardened it can be removed from the mold and placed in a furnace to have the epoxy burnt out. In this case the lower percentage PZT plate holds the structure together through burnout and sintering and insertion of the interstitial polymer. This layer also assists in surrounding the pillars during sintering and controlling the lead atmosphere to prevent lead depletion. This is especially useful when the pillars are small and present a large surface area to volume ratio.

In one embodiment the mold can be made from a photoresistive polymer (like SU8) where the structure has been lithographically etched into the photo sensitive polymer. Photoresists can comprise monomers that polymerize into dimensionally stable structures with the application of radiation usually in the form of ultraviolet (UV) light. The PZT slip can be pressed or vacuumed into the etched cavities and the structure can then be catalyzed and the polymers burnt out in a furnace. In many cases this burning out can be more efficiently achieved if the atmosphere in the furnace has its oxygen content elevated. This lithographic mold applies no forces to the PZT structure so higher aspect ratio parts can be manufactured. The choices of polymers with thermal expansion ratios and vapor losses an solidifying and epoxies that sublimate and oxidize can all be used to optimize the fabrication of apart.

In an example, material referred to as interstitial material is a polymer that in the final part holds the pillars in the transducer. This material is inserted between the pillars as a liquid and then catalytically hardened to adhere to the pillars and supply a structure that will support the electrodes that are used to apply and sense the electrical fields. This interstitial material may be extended well beyond the PZT pillar matrix where is can support the electronic components that are used to create the applied electrical fields and support the components that sense the resultant electrical fields. In one embodiment this interstitial material is molded into the pillar matrix while being molded into a form that supports the assembly of some electronic functions. This mold may have a three dimensional shape that includes small pins that when the interstitial polymer has catalyzed or polymerized and hardened into a solid and is removed from the mold the small pins will have created holes in the assembly that form the function of vias that may be plated with a conductor that allows signal transfer from one side of the assembly to another. The interstitial material may have photoresists applied to it and the masked exposure and developing of these photoresists can be used to form printed circuits in much the same way as conventional printed circuit boards are made with say FR4 being used. The interstitial material may be an epoxy, urethane, polyimide or other polymer with suitable characteristics. Some of the characteristics sought are acoustic properties, such as, the reduction of cross coupling of energy from one pillar to its neighbors. In some cases a composite polymer may be used as an interstitial material where the polymer is mixed with micro spheres or glass fibers for acoustic or structural improved properties.

A difficulty with piezo transducers as a whole is that the applied electrical field causes the thickness to increase or decrease, depending on the polarity of the electrical field applied, and this causes both the anterior and posterior walls to move causing pressure and refraction waves to propagate both forward and backward from the transducer. This backward wave propagating from the posterior surface is usually undesirable as it will also give rise to backscatter from objects behind the transducer which when reflected back to the transducer will interfere with the desired backscatter from the desired sensing field in front of the transducer. One solution is to couple the back projected wave into an absorbing medium, which will generate minimal reflections. To absorb the energy the material must firstly be well coupled to the transducer and this either an equivalent acoustic index or transformed to the index of the transducer. Thus half the energy (all the energy fro the back face) will be coupled out of the transducer and ideally lost. An alternative is to mismatch the acoustic index of the backing material which will cause the energy to be reflected at this interface and travel back across the transducer to the front surface where it will become a part of the forward propagated energy. This allows the transducer to gain twice the power and sensitivity but may have other more complex effects on the transducer's bandwidth and pulse performance.

It is often desirable to use this so-called "air backing" approach. It derives the name from the lowest acoustic index are attainable in gasses and the, highest miss-match obtainable for a PZT transducer would be for an air interface. A true air interface is unsupporting and not often used due to the fragile characteristics it introduces.

In one embodiment, small pockets are lithographically etched in a photosensitive polymer that match the positions of the pillars. This layer of etched polymer can be adhered to the back of the transducer so that every PZT pillar has its posterior end interfaced to a pocket filled with air or a gas. The interstitial material separating and securing the pillars would be attached to areas of this backing layer that have not been etched. The displacement of a transducer is on the order of hundreds of nanometers so a pocket etched to a depth of 25 microns, for example, would be more than adequate to assure the posterior coupling of air was not compromised by transducer movement. This backing layer could be 50 to 100 microns thick, for example, (see e.g., layer 220 in FIG. 2) and would be sufficiently strong to prevent any external surface compromising the air pockets. This relatively thin layer can be flexible and in turn adhered to any other substrate and will assure that there will be no propagation of a back wave or energy. This pocketed backing layer can be made of many photosensitive polymers like polyimides, epoxies, methyl acurates, and polyesters (such as, but not limited to layer 220 in FIG. 2). The pockets could also be fabricated by molding the polymer layer.

This transducer fabricated in composite layers can be molded into a 3 dimensional structure or a flat plane, covered in photo resist and be sputtered or plated with an electrical circuit that can support other electronic components (see, for example, transducer 200). In this fashion the possible very high number of electrodes required to address individual apertures in a 1 or 2 dimensional array may be connected to circuitry such a multiplexes that reduce the required number of electrical signals without a connector. A connector cumbersome, expensive, unreliable and degrades signal integrity. In some transducer applications hundreds and even thousands of electrical apertures need to be addressed individually. A connector would be impractical or impose severe limitations on the size and electrical performance of the transducer. Attaching front-end electronics to the transducer substrate or interstitial layer by commonly deposited circuitry facilitates attachment of integrated circuits by soldering, welding and bumping techniques.

In efforts to reduce or remove grating lobes in phased array and linear array transducers, the aperture width of each element must be less than one half of the wavelength of the transmitted and received frequency. As frequencies are increased to attain higher resolution, the apertures become only tens of microns across. The sensitivity of small apertures becomes a performance factor as their impedance increases to levels at which it is difficult to inject sufficient energy or on receive sense the small capacitance. The PZT pillar in the composite has a permittivity value of several hundred to several thousand while the polymer has a permittivity of less than ten. It is therefore very important to electrode the end of the pillar completely and it is not as valuable to electrode the polymer. As the apertures become smaller and closer together the separation of electrical circuits is important. Because of the higher voltages required to excite, the higher impedance apertures can cause arc over and shorts.

A method of plating the entire end of the electrode is to use a translucent interstitial material, coat the posterior surface of the composite with a photoresistive polymer and expose the photo resist by illuminating the anterior surface of the composite with for example UV light. The PZT pillars will shade the photoresist and it will not polymerize on the posterior end of the pillar allowing it to be developed away and a sputtering of electroless plating technique to electrode the pillar's end. In this way, the interstitial material is translucent to allow passage of the UV thru it to expose a photoresist on the down side which polymerizes the photoresist in the spaces between the pillars allowing removal of the unexposed resist that was shaded by the pillar. Access is then attained to the pillar end for sputtering or activation by a Palladium/Tin/NaCl solution.

The composite is flipped and the opposite and is also electroded. This method provides perfect alignment of the electrode and the PZT pillar. The pillars having been molded and sintered by methods described above may have moved out of perfect alignment due to expansions in the relatively high sintering process. This method of electroding minimizes the difficulties encountered in electroding ripe irregular apertures. The individual pillars may be joined into apertures by interconnecting them with fine lithographically masked wires which may be smaller than the pillars cross sections and thus mitigating the conflicting requirements of electrical separation and as large an electrode as possible for sensitivity.

The increase in impedance of an aperture comprising of PZT pillars and composite as the area of the aperture is decreased can be mitigated by stacking layers of composite material. Each layer comprises of an electrical circuit on both sides of the pillars supported in the interstitial polymer. If the layers are, thinner the capacitance of an aperture will increase and the impedance in general at a frequency will be lower. If several layers are aligned so the electroded pillars are aligned the resonant frequencies of the total stacked pillar can be designed from the total length and the individual layer thickness. The layers of the PZT pillars must be mechanically joined so they move together throughout the joint. Electrical waveforms can be applied to each electrode in the stack to facilitate numerous features and performance improvements. To join the pillar sections at the conductive electrodes between the layers a low temperature welding process may be used. In one embodiment the plated electrodes which comprise of either a sputtered layer of chromium, a sputtered layer of gold, a plated layer of gold and a plated layer of indium or a solution deposited layer of palladium, a plated layer of gold and a plated layer of indium are welded in an environment at 180 degrees centigrade. This environment is designed to not melt or degrade the interstitial polymer while melting the indium of two adjacent electrodes that are pressed together. If the melting process is continued for some time some of the gold layer will migrate into the indium melt and form an amalgam of higher tensile strength and hardness. This high temperature environment may be created in an oven or a florinert cloud. The surface tension of the molten metal will also serve to align the layers if they are allowed to float.

A piezoelectric composite transducer is constructed of molded pillars using polymer bound slips. This construction is low cost and provides performance enhancements. Loading of the slip with specific ratios of PZT allow strong and weak structures to be interchanged as their use is changed during fabrication. A air backing by etching or molding micro pockets into a thin polymer layer that align just over the active pillars in the array that prevents energy being propagated off the posterior wall of the transducer. A welding method to produce stacks of PZT composite for performance improvements is described.

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. A composite piezoelectric apparatus comprising:
a sacrificial base comprising a first composite piezoelectric material, said first composite piezoelectric material having a first volume percent of first piezoelectric material; and
a pillar array having a plurality of pillars, each pillar having a second composite piezoelectric material, said second composite piezoelectric material having a second volume percent of second piezoelectric material, wherein said first volume percent is lower than said second volume percent,; and said sacrificial base is removably held directly to a surface of said pillar array.

2. The apparatus of claim 1, wherein said first volume percent is about 30–40%.

3. The apparatus of claim 1, wherein said second volume percent is about 50%–65%.

4. The apparatus of claim 1, wherein said second volume percent is about 60%–65%.

5. The apparatus of claim 1, wherein said first and second piezoelectric materials comprise lead zirconate titanate (PZT).

6. A method of manufacturing a composite piezoelectric transducer from a sacrificial base and pillar array, comprising:
- molding the sacrificial base with a first slip, said first slip comprising a first composite piezoelectric material, said first composite piezoelectric material having a first volume percent of first piezoelectric material; and
- molding the pillar array with a second slip, said second slip having a second composite piezoelectric material, said second composite piezoelectric material having a second volume percent of second piezoelectric material, wherein said first volume percent is lower than said second volume percent, whereby, said sacrificial base can be easily removed from the pillar array after the molded base and pillar array are sintered in the manufacture of the composite piezoelectric transducer.

7. A composite piezoelectric transducer made by the process of claim 6.

8. A method of manufacturing a composite piezoelectric transducer from a sacrificial base and pillar array, comprising:
- molding the sacrificial base with a first slip, said first slip comprising a first composite piezoelectric material, said first composite piezoelectric material having a first volume percent of first piezoelectric material
- molding the pillar array with a second slip, said second slip having a second composite piezoelectric material, said second composite piezoelectric material having a second volume percent of second piezoelectric material, wherein the pillars each have longitudinal sides and two end sides;
- inserting interstitial material around the longitudinal sides of the pillars of said pillar array; and
- forming air pockets on one end side of pillars of said pillar array within the composite piezoelectric transducer, wherein said first volume percent is lower than said second volume percent, whereby, said sacrificial base can be easily removed from the pillar array after the molded base and pillar array are sintered in the manufacture of the composite piezoelectric transducer.

9. The method of claim 7, wherein said air pockets forming step comprises:
- lithographically etching a photoresistive substrate to form etched pits at positions corresponding to pillar positions; and
- positioning said etched substrate such that said pits are opposite the one end side of the pillars to form the air pockets within the composite piezoelectric transducer.

10. A composite piezoelectric transducer stack comprising:
- a pillar array having pillar regions made up of piezoelectric material and separated by interstitial material;
- element electrodes coupled to pillars in said pillar array; and
- a photoresistive substrate having etched pits opposite one end side of the pillars to form air pockets within the composite piezoelectric transducer.

* * * * *